(12) United States Patent
Yasuda et al.

(10) Patent No.: US 12,413,217 B1
(45) Date of Patent: Sep. 9, 2025

(54) DUTY COMPENSATION SCHEME

(71) Applicant: INTERNATIONAL BUSINESS MACHINES CORPORATION, Armonk, NY (US)

(72) Inventors: Takeo Yasuda, Nara (JP); Kohji Hosokawa, Ohtsu (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 56 days.

(21) Appl. No.: 18/597,351

(22) Filed: Mar. 6, 2024

(51) Int. Cl.
*H03K 5/14* (2014.01)
*H03K 5/135* (2006.01)

(52) U.S. Cl.
CPC ............... *H03K 5/14* (2013.01); *H03K 5/135* (2013.01)

(58) Field of Classification Search
None
See application file for complete search history.

(56) References Cited

U.S. PATENT DOCUMENTS

| 6,667,645 | B1* | 12/2003 | Fletcher | G06F 1/10 |
| | | | | 327/201 |
| 6,927,615 | B2 | 8/2005 | Dhong et al. | |
| 7,888,991 | B2* | 2/2011 | Lin | H03K 3/35613 |
| | | | | 327/539 |
| 7,961,559 | B2 | 6/2011 | Dixon et al. | |
| 9,577,615 | B1 | 2/2017 | Ganusov et al. | |
| 11,671,086 | B2* | 6/2023 | Kimura | H03K 5/1565 |
| | | | | 327/175 |
| 12,183,427 | B1* | 12/2024 | Gugwad | G11C 7/14 |
| 2006/0170480 | A1 | 8/2006 | Chiu et al. | |
| 2009/0160515 | A1 | 6/2009 | Warnock et al. | |
| 2016/0179074 | A1* | 6/2016 | Kim | H03K 3/356104 |
| | | | | 326/46 |

FOREIGN PATENT DOCUMENTS

CN 107453750 A 12/2017

OTHER PUBLICATIONS

Kaushik, P. G., Gulhane, S. M., & Khan, A. R. (Mar. 1, 2013). Dynamic power reduction of digital circuits by clock gating. International Journal of Advancements in Technology, 4(1), 79-88.
Wang, Y. M., & Wei, S. N. (May 14, 2014). Range unlimited delay-interleaving and-recycling clock skew compensation and duty-cycle correction circuit. IEEE Transactions on Very Large Scale Integration (VLSI) Systems, 23(5), 856-868.

* cited by examiner

*Primary Examiner* — Cassandra F Cox
(74) *Attorney, Agent, or Firm* — Tutunjian & Bitetto, P.C.; Kimberly Zillig

(57) ABSTRACT

A global clock signal distribution system includes a distribution line that includes gates for signal distribution, a function block gate with at least two input ports and a duty compensation gate with at least two input ports. The duty compensation gate is inserted in the distribution line following the function block gate for balancing rise-to-fall delay and fall-to-rise delay. The duty compensation gate delays an earlier arrived edge of the clock signal more than a later arrived edge of the clock signal to compensate delay unbalance.

20 Claims, 12 Drawing Sheets

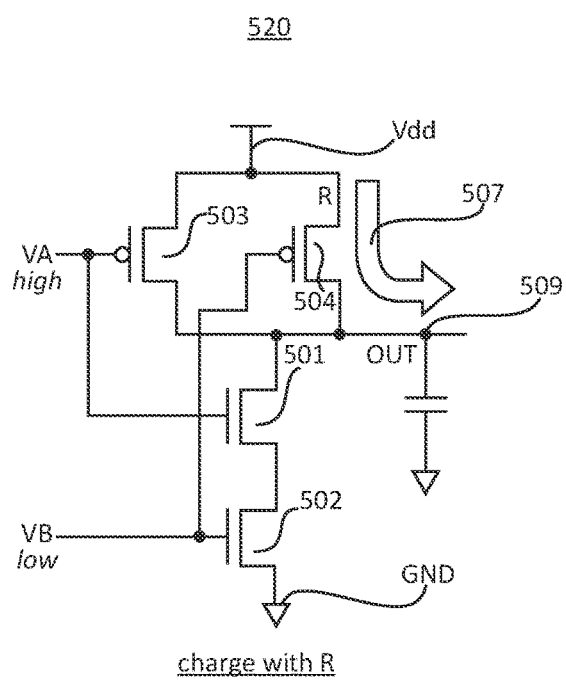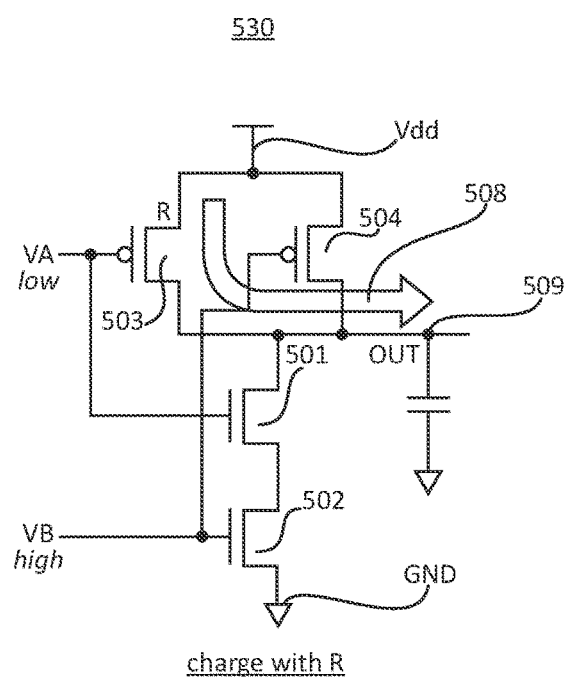
FIG. 5
FIG. 6

1100

Embedding a function block 140, 340,150 with two-input gate 99 within a signal distribution line 200 for specific function such as clock-gating or clock switching
1101

Inserting duty-compensation block 160 with two-input gate 107 within a signal distribution line 200 following the function block 140, 340, 150 for compensation of degraded duty ratio, wherein the two-input gate 107 in the duty-compensation block 160 has a same electrical performance as the two-input gate 99 on the function block 140, 340 150 does.
1102

Inputting the duty-degraded signal by the two-input gate 99 in the function block 140, 340, 150 to a first input 109 of the two-input gate 107 in the duty-compensation block 160 after slew recovery and polarity adjustment
1103

Supplying constant high level to a second input 105 of the two-input gate 107 in the duty-compensation block 160.
1104

Outputting a duty compensated signal from the two-input gate 107 in the duty-compensation block 160 to the following distribution line 200.
1105

FIG. 11

TABLE 1: RING OSCILLATOR SIMULATION RESULTS ⟵ 1401

| original | RO1_out | RO2_out | RO3_out | RO4_out | RO5_out | RO6_out | RO7_out | RO8_out | RO9_out | RO10_out | RO11_out | RO12_out | RO13_out |
|---|---|---|---|---|---|---|---|---|---|---|---|---|---|
| 3rd fall (ns) | 1.75298 | 6.752983 | 11.75298 | 16.75298 | 21.75298 | 26.75298 | 31.75298 | 36.75298 | 41.75298 | 46.75298 | 51.75298 | 56.75298 | 61.75298 |
| 4th rise (ns) | 1.92439 | 6.924398 | 11.92439 | 16.9244 | 21.9244 | 26.9244 | 31.92439 | 36.9244 | 41.9244 | 46.9244 | 51.9244 | 56.9244 | 61.92439 |
| 4th fall (ns) | 2.09629 | 7.0963 | 12.0963 | 17.0963 | 22.0963 | 27.0963 | 32.9663 | 37.0963 | 42.0963 | 47.0963 | 52.0963 | 57.0963 | 62.09629 |
| duty(%) | 50.07 | 50.07 | 50.07 | 50.07 | 50.07 | 50.07 | 50.07 | 50.07 | 50.07 | 50.07 | 50.07 | 50.07 | 50.07 |
| monitor signal | 1241/1341 | 1242/1342 | 1243/1343 | 1244/1344 | 1245/1345 | 1246/1346 | 1247/1347 | 1248/1348 | 1249/1349 | 1250/1350 | 1251/1351 | 1252/1352 | 1253/1353 |
| activated enable signal | 1261/1361 | 1262/1362 | 1263/1363 | 1264/1364 | 1265/1365 | 1266/1366 | 1267/1367 | 1268/1368 | 1269/1369 | 1270/1370 | 1271/1371 | 1272/1372 | 1273/1373 |

TABLE 2: RO$_x$ TO CLOCK SWITCHING MULTIPLEXER OUTPUT WITHOUT COMPENSATION ⟵ 1402

| original | RO1 to OUT | RO2 to OUT | RO3 to OUT | RO4 to OUT | RO5 to OUT | RO6 to OUT | RO7 to OUT | RO8 to OUT | RO9 to OUT | RO10 to OUT | RO11 to OUT | RO12 to OUT | RO13 to OUT |
|---|---|---|---|---|---|---|---|---|---|---|---|---|---|
| 3rd fall (ns) | 3.46839 | 8.36983 | 13.22882 | 18.12653 | 22.98559 | 27.88335 | 32.7424 | 37.64018 | 42.499244 | 47.39701 | 52.256074 | 57.15384 | 62.0129 |
| 4th rise (ns) | 3.60649 | 8.50733 | 13.36937 | 18.27011 | 23.13219 | 28.03297 | 32.89506 | 37.79587 | 42.657977 | 47.55877 | 52.420874 | 57.32167 | 62.18377 |
| 4th fall (ns) | 3.81188 | 8.71334 | 13.57233 | 18.47006 | 23.32903 | 28.22673 | 33.08572 | 37.98349 | 42.84256 | 47.74032 | 52.599391 | 57.49716 | 62.35622 |
| duty(%) | 59.80 | 59.97 | 59.08 | 58.20 | 57.31 | 56.43 | 55.53 | 54.65 | 53.78 | 52.88 | 52.00 | 51.12 | 50.23 |
| monitor signal | 1299 | 1299 | 1299 | 1299 | 1299 | 1299 | 1299 | 1299 | 1299 | 1299 | 1299 | 1299 | 1299 |
| activated enable signal | 1261 | 1262 | 1263 | 1264 | 1265 | 1266 | 1267 | 1268 | 1269 | 1270 | 1271 | 1272 | 1273 |

TABLE 3: RO$_x$ TO CLOCK SWITCHING MULTIPLEXER OUTPUT WITH DUTY COMPENSATION ⟵ 1403

| duty comp. | RO1 to OUT | RO2 to OUT | RO3 to OUT | RO4 to OUT | RO5 to OUT | RO6 to OUT | RO7 to OUT | RO8 to OUT | RO9 to OUT | RO10 to OUT | RO11 to OUT | RO12 to OUT | RO13 to OUT |
|---|---|---|---|---|---|---|---|---|---|---|---|---|---|
| 3rd fall (ns) | 3.527606 | 8.42908 | 13.28312 | 18.17593 | 23.03001 | 27.92284 | 32.77697 | 37.6698 | 42.52393 | 47.41677 | 52.27089 | 57.16373 | 62.01785 |
| 4th rise (ns) | 3.701257 | 8.60212 | 13.45629 | 18.34915 | 23.20332 | 28.09617 | 32.95037 | 37.84327 | 42.69747 | 47.59039 | 52.44457 | 57.33748 | 62.19168 |
| 4th fall (ns) | 3.87125 | 8.77254 | 13.62659 | 18.51942 | 23.37345 | 28.26623 | 33.12028 | 38.01312 | 42.86724 | 47.76008 | 52.61421 | 57.50704 | 62.36177 |
| duty(%) | 49.45 | 49.62 | 49.58 | 49.57 | 49.54 | 49.52 | 49.49 | 49.47 | 49.45 | 49.43 | 49.41 | 49.39 | 49.37 |
| monitor signal | 1399 | 1399 | 1399 | 1399 | 1399 | 1399 | 1399 | 1399 | 1399 | 1399 | 1399 | 1399 | 1399 |
| activated enable signal | 1361 | 1362 | 1363 | 1364 | 1365 | 1366 | 1367 | 1368 | 1369 | 1370 | 1371 | 1372 | 1373 |

FIG. 14

DUTY COMPENSATION SCHEME

BACKGROUND

The present invention relates generally to global signal distribution in circuits, and more particularly to compensating duty (ratio) in global signal distribution schemes including two-input gates.

Global signaling in LSI (Large Scale Integration) refers to the transmission of signals across a large portion of an integrated circuit. These signals are used to synchronize and coordinate the operation of various components within the chip.

In electronics and especially synchronous digital circuits, a clock signal is an electronic logic signal (voltage or current) which oscillates between a high and a low state at a constant frequency and is used like a metronome to synchronize actions of digital circuits.

Clock signals are common global signals, which require high distribution quantity in several performance specification times, such as duty (ratio), skew and slew. Duty ratio is the percentage of high period in clock pulse. Ideal clock waveforms have 50% duty ratio. Slew is the time taken by a change in state. Skew, in LSI, is the difference in clock arrival times at inputs of clock boundary blocks, such as, d-flip flops or d-latches which receive the same clock signal.

Clock signal gating is used to reduce power consumption. A system's clock signal consumes power in electronics products and is responsible for transition states of the components, which leads to the switching power consumption. Several techniques are used to reduce power consumption. Some of the developed techniques include power-gating, clock-gating, and adiabatic logic. In clock-gating techniques, the unwanted clock signal is deactivated or blocked and, by this activity, low dynamic power consumption can be achieved.

Clock signal switching can be used for multi-clock systems. With more multi-frequency clocks being used in today's chips, especially in the communications field, it is often necessary to switch the source of a clock line while the chip is running. This is usually implemented by multiplexing two different frequency clock sources in hardware and controlling the multiplexer select line by internal logic.

NAND (or AND) or NOR (or OR) gates (2-input gates) can be used for clock-gating or clock-switching. Additionally, multiple inverters and buffer gates may be positioned with the input gates for signal distribution. Because of the circuit asymmetry of the 2-input gates, signal duty degrades after clock-gating and clock-switching. It is possible to balance the delay for a specific circuit, but this is not a global solution due to process, voltage and temperature variations across the entirety of a system. Active duty tuning strategies, such as clock doubling and dividing, may also be applied. However, there are area penalties, increases in power consumption, and design costs associated with active duty tuning that are not negligible.

SUMMARY

Embodiments of the present invention can overcome signal duty degradation that results from circuit asymmetry when employing two-input gates in a duty-compensation scheme. The duty compensation scheme can be used in global signal distribution in large block circuits or large scale integration (LSI). In some embodiments, the devices and methods of the present invention overcome the aforementioned disadvantages by inserting the compensation gates in the distribution line of the clock distribution scheme having a similar structure at the input gates used for receiving the input signal for clock gating or clock switching. In some embodiments, by inserting the compensation gates into the distribution line, the duty-compensation scheme can delay the earlier edge of the clock signal in order to compensate the unbalance in delay that results from the two-input gates at the clock-gating or clock-switching point.

In an embodiments, a global clock signal distribution system includes a distribution line that includes gates for signal distribution, a function block gate with at least two input ports and a duty compensation gate with at least two input ports. The duty compensation gate is inserted in the distribution line following the function block gate for balancing rise-to-fall delay and fall-to-rise delay. The duty compensation gate delays an earlier arrived edge of the clock signal more than a later arrived edge of the clock signal to compensate delay unbalance.

In other embodiments, the gates for signal distribution can include inverter gates or buffer gates. The function block gate with multiple input ports can be configured for clock-gating or for clock-switching. The function block gate and the duty compensation gate can structurally be the same. The duty compensation gate can receive a clock signal before duty compensation to a first input port with a constant high signal to a second input port. The duty compensation gate can be positioned proximate to the function block gate to have a same electrical performance. An equal number of function block gates and duty compensation gates can be placed in the clock signal distribution line to select one clock signal out of multiple input clock signals.

In accordance with embodiments of the present invention, a global clock signal distribution system includes a distribution line that includes gates for signal distribution and a function block having gates with at least two-input ports. Duty compensation gates have at least two input ports. The function block gate and the duty compensation gate are structurally the same, and the duty compensation gate is inserted in the distribution line following the function-block gate for balancing rise-to-fall delay and fall-to-rise delay. The duty-compensation gates delay an earlier arrived edge of the clock signal more than a later arrived edge of the clock signal to compensate delay unbalance.

In other embodiments, the gates for signal distribution include inverter gates or buffer gates. The function block gate is configured for clock-gating or for clock-switching. The function block and the duty compensation gates have a same electrical performance. The duty compensation gate can receive a clock signal before duty compensation to the first input port and constant-high signal to the second input port. The duty compensation gate can be placed close to the corresponding function block gate to have a same electrical performance. An equal number of function block gates and duty compensation gates can be placed in the clock signal distribution line to select one clock signal out of multiple input clock signals.

In accordance with embodiments of the present invention, a global clock signal distribution method includes configuring a distribution line with gates for signal distribution and a function block gate with at least two input ports and positioning a duty compensation gate with at least two input ports in the distribution line following the function block gate, wherein the duty compensation gate balances rise-to-fall delay and fall-to-rise delay and the duty compensation gate delays an earlier arrived edge of the clock signal more than a later arrived edge of the clock signal to compensate delay unbalance.

In other embodiments, the function block gate with multiple input ports can be configured for clock-gating or clock-switching. The function block gate with multiple input ports and the duty-compensation gate with multiple input ports can have a same electrical performance. The duty compensation gate with multiple input ports can receive a clock signal before duty compensation to the first input port and constant high signal to the second port, wherein the duty compensation gate with multiple input ports is placed as close to the corresponding function block gate as possible to have a same electrical performance. The function block gate and the duty compensation gate can be placed in the clock signal distribution line to select one clock signal out of multiple input clock signals to generate a compensated clock signal.

BRIEF DESCRIPTION OF DRAWINGS

The disclosure will provide details in the following description of preferred embodiments with reference to the following figures wherein:

FIG. 5 is a circuit diagram for a NAND gate circuit illustrating a charging output node of the NAND circuit depicted in FIG. 3, in which a high signal is applied to the first port (VA) and a low signal is applied the second port (VB) of the NAND circuit, in accordance with an embodiment of the present invention;

FIG. 6 is a circuit diagram for a NAND gate circuit illustrating a charging output node of the NAND circuit depicted in FIG. 2, in which a low signal is applied to the first port (VA) and a high signal is applied the second port (VB) of the NAND circuit, in accordance with an embodiment of the present invention;

FIG. 11 is a block diagram illustrating a method for a duty-compensation scheme, in accordance with an embodiment of the present invention;

FIG. 14 illustrate tables providing simulation results in accordance with an embodiment of the present invention.

DETAILED DESCRIPTION OF PREFERRED EMBODIMENTS

Embodiments of the present invention can overcome signal duty degradation that results from circuit asymmetry when employing gates with multiple inputs in a duty-compensation scheme. The duty-compensation scheme can be employed in large block circuits or large scale integration (LSI) for signal distribution. In some embodiments, the devices and methods of the present invention overcome the aforementioned disadvantages by inserting same multi-input gates in the distribution line of the clock distribution scheme for duty compensation as the types of multi-input gates used for function blocks in the clock distribution scheme for clock-gating or clock-switching in a former stage. In some embodiments, by inserting the multi-input gates into the distribution line, duty degradation is compensated. The inserted multi-input gates delay the earlier edge of the clock signal more than a later edge to compensate the delay unbalance between rise-to-fall transfer time and fall-to-rise transfer time of inverting (NAND) gates that results from the two-input gates at the function block including clock-gating or clock-switching functions.

A clock distribution network distributes clock signals from a common source to all the electrical components that need the clock signal. This function provide for synchronous operation of a system. The clock distribution network helps ensure that critical timing requirements are satisfied, resulting in reliable operation and optimal performance.

Figure 1:
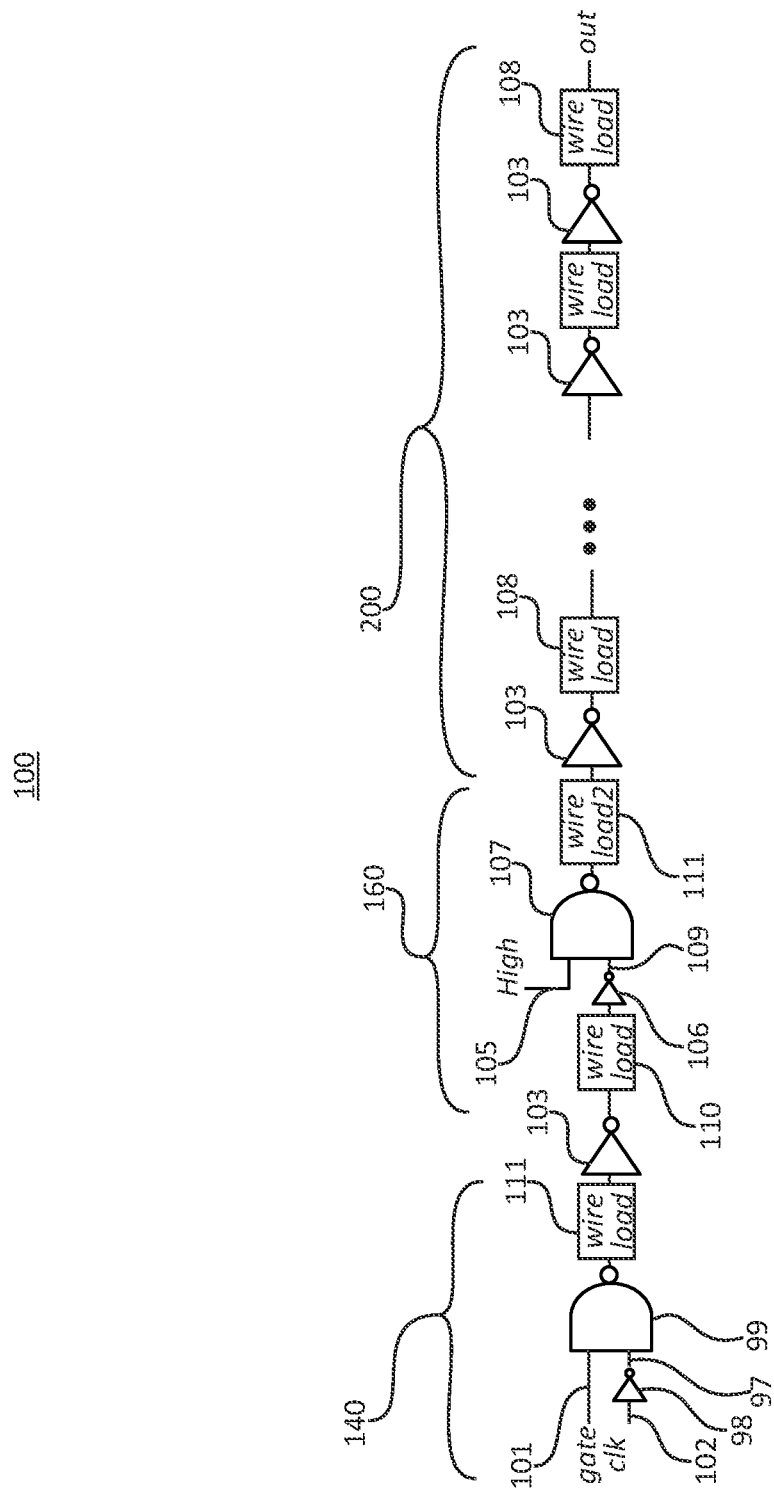
FIG. 1 is a circuit diagram for a clock distribution circuit with a clock-gating function applying duty compensation, in accordance with an embodiment of the present invention.

FIG. 1 is a circuit diagram for a clock distribution system with a clock-gating function applying duty compensation, in accordance with an embodiment of the present invention. In this circuit, clock signal "clk" 102 passes through to "out" node in a case where a gate signal "gate" 101 is high, while "out" node stays low in a case where gate signal "gate" 101 is low. In an embodiment, a global clock signal distribution system includes a function block 140 having a function block gate 99 with two input ports for clock-gating. In this case, the function of the function block 140 is clock-gating. For example, the function block 140 can include a small inverting gate 98 and a NAND gate 99 for clock-gating which has a first input port 97 and a second input port 101.

The global clock distribution system also includes a distribution line 200. The distribution line 200 includes several inverting gates 103 for signal distribution and several "wire loads" 108. A duty-compensation block 160 includes a small inverting gate 106, duty-compensation gate 107, "wire load 1" 110 and "wire load 2" 111, which are generated by dividing "wire load" 108 into two portions.

Figure 2:
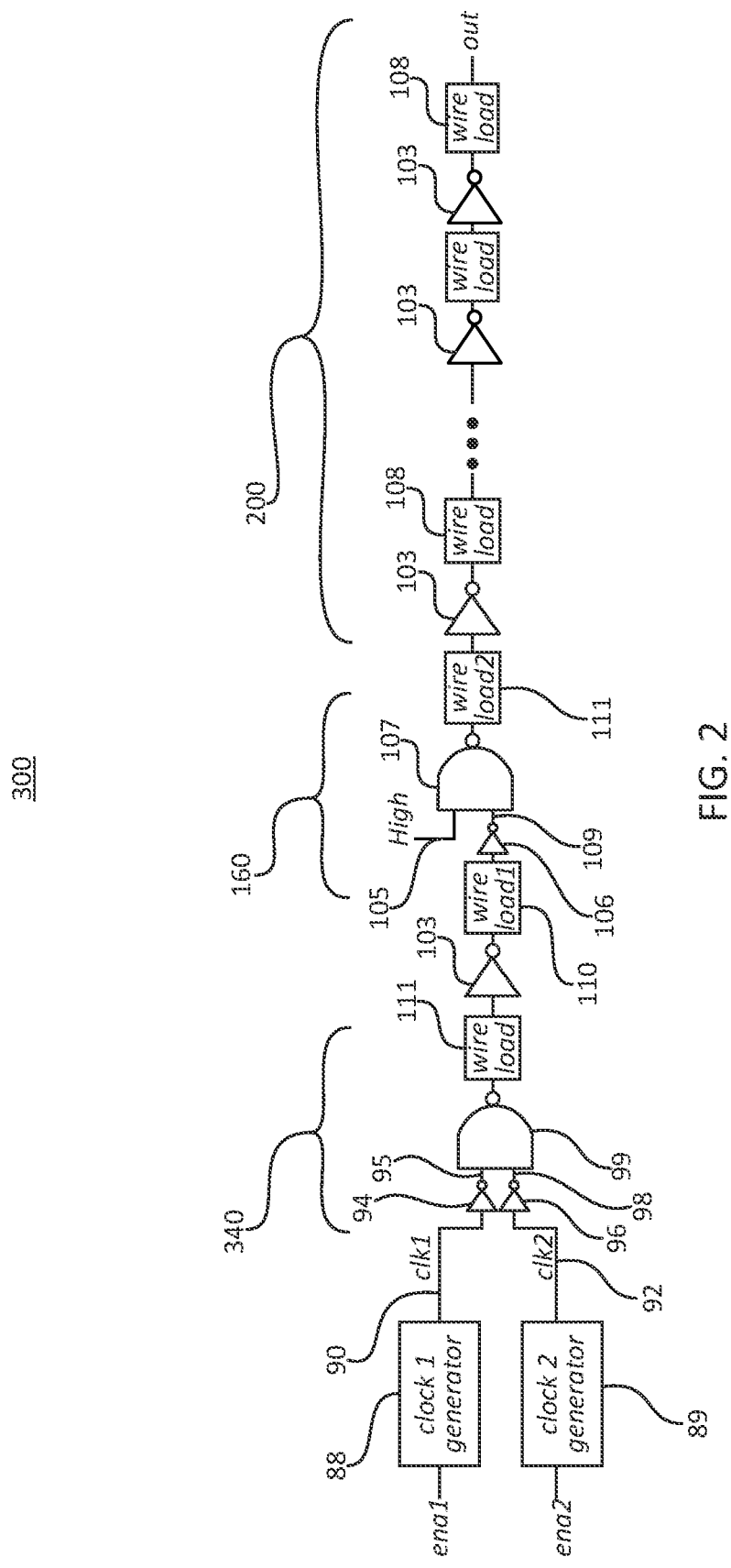
FIG. 2 is a circuit diagram for a clock distribution circuit with a clock-switching function applying duty compensation, in accordance with an embodiment of the present invention.

FIG. 2 is a circuit diagram for a clock distribution system with a clock-switching function applying duty compensation, in accordance with an embodiment of the present invention. In this circuit, one out of two clock signals "clk1" 90 and "clk2" 92 passes through to "out" node according to the ena1 and ena2 input signals. If "ena1" is activated (for example set high) and "ena2" is de-activated (for example set low), the clock signal is generated by "clock 1 generator" 88 to the "clk1" 90 node, and a constant low is generated by "clock 2 generator" 89 to the "clk2" 92 node. In an embodiment, a global clock signal distribution system includes a function block 340 having a function-block gate 99 with two input ports for clock-switching. In this case, the function of the function block 340 is clock-switching. For example, the function block 340 can include small inverting gates 94, 96 and a NAND gate 99 for clock-switching gate, which has a first input port 97 and a second input port 95.

The global clock distribution system also includes a distribution line 200. The distribution line 200 includes several inverting gates 103 for signal distribution and several "wire loads" 108. Duty-compensation block 160 includes a small inverting gate 106, duty-compensation gate 107, "wire load 1" 110 and "wire load 2" 111 which are generated by dividing "wire load" 108 into two portions.

For both circuits illustrated in both FIG. 1 and FIG. 2, the duty-compensation gates 107 are structurally the same as the clock-gating (function-block) gate 99 and clock-switching (function-block) gate 99 in the function blocks 140 and 340, respectively. The duty-compensation gate 107 has two input-ports, e.g., a first input port 109 and a second input port 105. The duty-compensation block 160 is positioned at a "wire load" 108 portion of the distribution line 200. The "wire load" 108 is divided into two wire load segments ("wire load 1" 110 and "wire load 2" 111) and the duty-compensation block 160 includes "wire load 1" 110 and "wire load 2" 111 at its input and output nodes, respectively. The duty-compensation gate 107 is placed to balance rise-fall delay. For example, the duty-compensation gate 107 is placed as close to the clock-gating or clock-switching (function-block) gate 99 as possible to make the unbalance of delay and slew for rising edge and falling edge minimum even with PVT variation by location. At least one gate with large enough size can be included between the clock-gating (function-block) gate 99 and the duty-compensation gate 107 to re-drive "wire load 1" 110 and to reshape clock waveform (minimizing slew) because each wire load has parasitic resistance and capacitance.

In the examples illustrated in FIG. 1 and FIG. 2, one inverting gate 103 is included between the clock-gating block 140 or clock-switching block 340 and the duty-compensation block 160 to recover signal slew before processing duty compensation with the duty-compensation gate 107. In some examples, the small inverting gate 106 that is placed at the input of the duty-compensation gate 107 is for polarity adjustment so that the shorter delay edge generated by the clock-gating or clock-switching (function-block) gate 99 has a longer delay in the duty-compensation gate 107, and a longer delay edge generated by the clock-gating or clock-switching (function-block) gate 99 has a shorter delay in the duty-compensation gate 107. In an embodiment, the first port 109 of the two-input gate 107 is connected to the "wire load 1" 110 through the polarity adjustment inverting gate 106, and the second input port 105 of the duty-compensation gate 107 is connected to constant-high signal such as power supply (Vdd) line (second signal port 105).

The gates described herein are logic gates. A "logic gate" is a device performing a Boolean logic operation on one or more binary inputs and then outputs a single binary output. When referring to the gates employed in the global clock signal distribution system, such as the function-block gate 99 and the duty-compensation gate 107, any logic gate type may be employed. For example, logic gate type employed in the function-block gate 99 and the duty-compensation gate 107 can be AND type logic gates, NAND type logic gates, OR type logic gates, NOR type logic gates, XNOR logic gates, and combinations thereof.

Digital circuits rely on clock signals to know when and how to execute the functions that are programmed. In some examples, the clock signal is a square wave with a fixed period. The period is measured from the rise or fall edge of one clock to the next same-type edge of the clock. In some examples, the clock signal oscillates between a high and low state (or level). With respect to circuits 100 and 300 illustrated in FIG. 1 and FIG. 2, respectively, most of the multi-input gates have unbalanced delay and slew between input switching to output-rise switching, and from input switching to output-fall switching.

Figure 3:
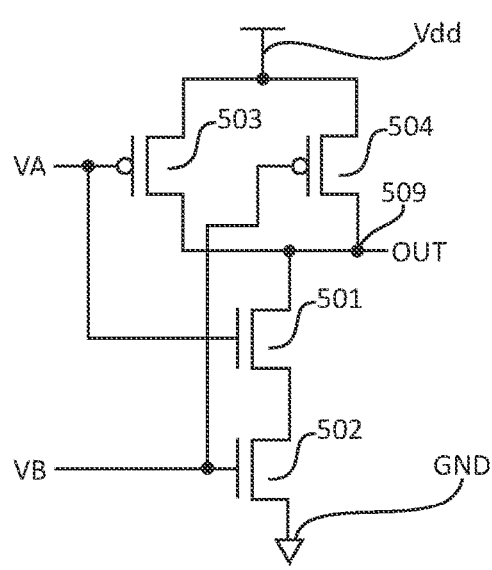
FIG. 3 is a circuit diagram for a NAND gate circuit with two input ports (VA and VB), in accordance with an embodiment of the present invention.

FIG. 3 is a circuit diagram for a NAND gate circuit 500 with a first port VA, and a second port VB. The NAND gate circuit 500 depicted in FIG. 3 provides one example of a logic gate that can be used in the clock distribution system described above with reference to FIG. 1. For example, the NAND gate circuit 500 can provide the circuitry for the function-block gate 99 and the duty-compensation gate 107 that are depicted in FIG. 1. In one example, the NAND gate circuit 500 includes a first N-type MOSFET 501 and a second N-type MOSFET 502 that are connected in series, and the NAND gate circuit includes a first P-type MOSFET 503 and a second P-type MOSFET 504 that are connected in parallel. The first port VA is connected to the gate nodes of the first N-type MOSFET 501 and the first P-type MOSFET 503. The second port VB is connected to the gate nodes of the second N-type MOSFET 502 and the second P-type MOSFET 504. The same drain-source resistance is assumed to be "R" for all of these MOSFETs (the first N-type MOSFET 501, the second N-type MOSFET 502, the first P-type MOSFET 503 and the second P-type MOSFET 504), and, in this case, they are in an ON state. The resistance is assumed to be infinity "∞" for all of the MOSFETs (the first N-type MOSFET 501, the second N-type MOSFET 502, the first P-type MOSFET 503 and the second P-type MOSFET 504) and, in this case, they are in an OFF state.

The output rise and fall transition operations of NAND gate for the clock-gating and clock-switching circuits are described with reference to FIGS. 4, 5 and 6.

Figure 4:
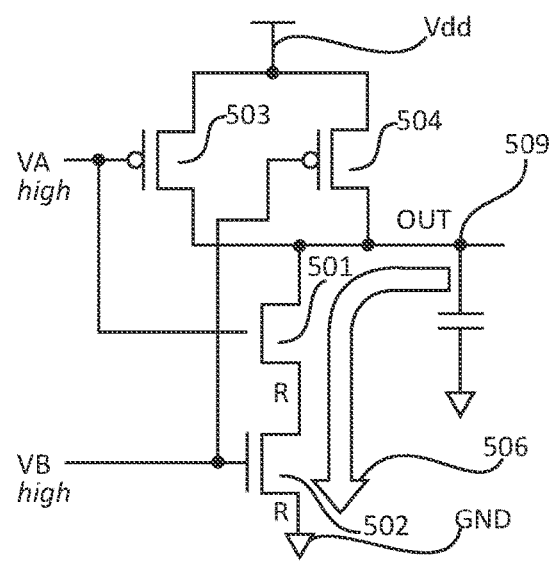
FIG. 4 is a circuit diagram for a NAND gate circuit illustrating a discharging output node of the NAND circuit depicted in FIG. 3, in which a high signal is applied to both the first port (VA) and the second port (VB) of the NAND circuit, in accordance with an embodiment of the present invention.

FIG. 4 illustrates a circuit instance 510 with an output discharge (fall transition) operation for specific input signals to the NAND circuit 500 depicted in FIG. 3. In FIG. 4, a high signal is applied to both the first port VA and the second port VB of the NAND circuit 500. This turns ON both the first N-type MOSFET 501 and the second N-type MOSFET 502 and turns OFF both the first P-type MOSFET 503 and the second P-type MOSFET 504, which results in the charge on OUT node passing to a GND node through the first N-type MOSFET 501 and the second N-type MOSFET 502, which are connected in series. The series connected two N-type MOSFET 501 and 502 show double the discharge resistance (2R) of each drain-source ON resistance (R), which results in a smaller discharge current 506 and longer slew compared with discharging OUT node in the single device (ON resistance "R") case. This discharge current 506 also causes longer transfer delay from an "input rise" edge to an "output fall" edge compared with the single device case.

FIG. 5 illustrates a circuit instance 520 with an output charge (rise transition) operation for a specific input signal to the NAND circuit 500 depicted in FIG. 3. In FIG. 5, a high signal is applied to the first port VA, and a low signal is applied to the second port VB of the NAND circuit 500. This turns ON the second P-type MOSFET 504 and turns OFF the first P-type MOSFET 503, the first N-type MOSFET 501 and the second N-type MOSFET 502, which results in the charge on Vdd node passing to OUT node through the second P-type MOSFET 504 only. The charge current 507 and slew are equal to the ones charging OUT node with singe device (ON resistance "R") case. This charge current 507 also causes the same transfer delay from the "input fall" edge to the "output rise" edge as in the single device case.

FIG. 6 illustrates a circuit instance 530 with an output charge (rise transition) operation for another specific input signal to the NAND circuit 500 depicted in FIG. 3. In FIG. 6, a low signal is applied to the first port VA, and a high signal is applied to the second port VB of the NAND circuit 500. This turns ON the first P-type MOSFET 503 and turns OFF the second P-type MOSFET 504, the first N-type MOSFET 501 and the second N-type MOSFET 502, which results in the charge on Vdd node passing to OUT node through the first P-type MOSFET 503 only. The charge current 508 and slew are equal to the ones for the charging OUT node for a single device (ON resistance "R") case. This charge current 508 also causes a same transfer delay from the "input fall" edge to the "output rise" edge as the single device case.

The difference between the small output discharge current 506 through the series connected first N-type MOSFET 501 and the second N-type MOSFET 502 and the large output charge current 507 or 508 through the second P-type MOSFET 504 or the first P-type MOSFET 503 causes unbalanced delay and slew. The delay from the input node (VA or VB) falling to the OUT node rising is smaller than the delay from input node (VA or VB) rising to the OUT node falling. The slew for the OUT node rising is larger than the slew for the OUT node falling.

Figure 7:
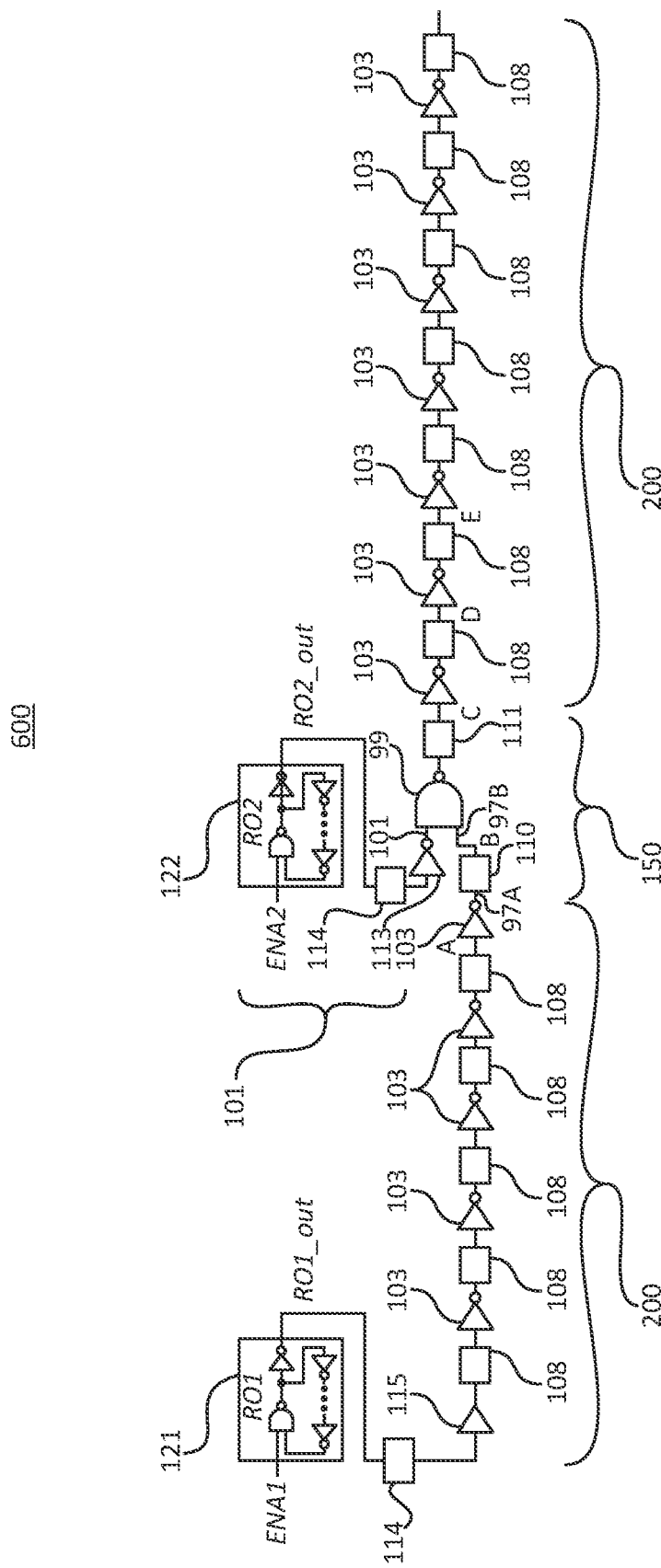
FIG. 7 is a circuit diagram of clock distribution line with a clock-switching function for illustrating duty ratio degradation by a clock-switching block without a duty-compensation block, in accordance with an embodiment of the present invention.

FIG. 7 is a circuit diagram showing a circuit 600 for illustrating duty ratio degradation by the function-block gate 99. In this example, function block 150 implements the clock-switching function, and it is embedded in the clock distribution circuit. The first input port 97A and 97B to the function-block gate 99 includes a "wire load 1" 110. The first input of the clock-switching gate 99 receives the output signal RO1_out of Ring Oscillator 1 (RO1) 121. The output node of the Ring Oscillator 1 (RO1_out) is connected to this first input port 97B of the clock-switching gate 99 through an odd number of inverting gates 103, one or some buffer gate(s) 115 and some "wire loads" 108 between these inverting gates 103. The second input port 101 of the clock-switching gate 99 receives the output signal of Ring Oscillator 2 (RO2) 122. The output node of the Ring Oscillator 2 (RO2_out) is connected to this second input port 101 of the clock-switching gate 99 through a "wire load" 114 and an inverting gate 113.

In this example, either RO1_out or RO2_out is enabled by setting either ENA1 (enable signal of RO1) or ENA2 (enable signal of RO2). If ENA1 is enabled (set high) and ENA2 is disabled (set low), the second input port 101 of the clock-switching gate 99 is forced to high and RO1 out signal is passed through the clock-switching gate 99. If ENA1 is disabled (set low) and ENA2 is enabled (set high), the first input port 97B of the clock-switching gate 99 is forced to high and RO2_out signal is passed through the clock-switching gate 99. Following the clock-switching block (function block) 150, a distribution line 200 that includes several inverting gates 103 and several "wire loads" 108 is attached.

Figure 8:
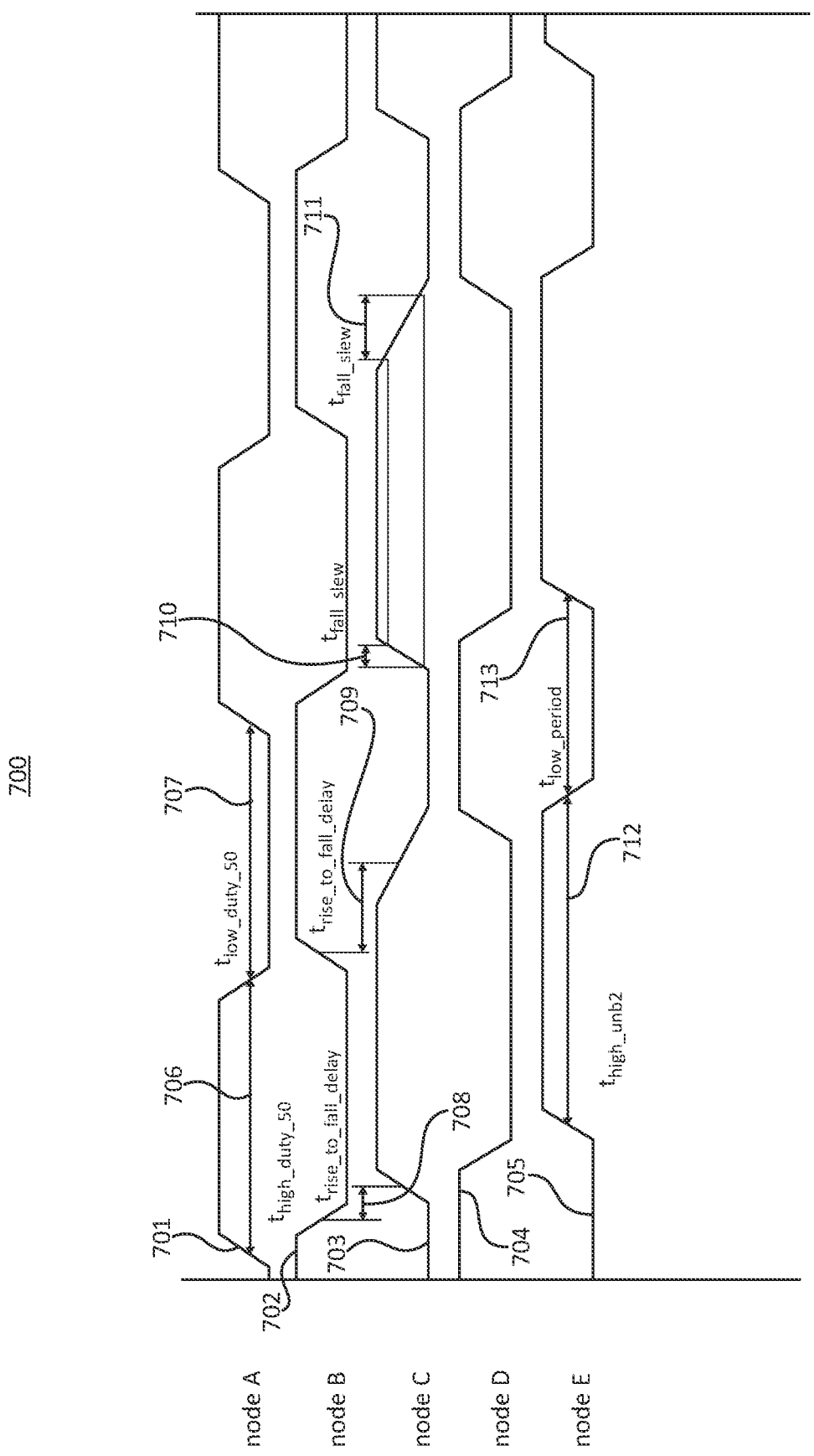
FIG. 8 is a timing diagram illustrating duty ratio degradation caused by the circuit illustrated in the circuit diagram FIG. 7, in accordance with an embodiment of the present invention.

FIG. 8 is a timing diagram 700 illustrating the duty ratio degradation for the circuit diagram illustrated in FIG. 7. The following case assumes that RO1 121 output clock (RO1_out) is selected (enabled) by activating ENA1, and RO2 122 output clock (RO2_out) is not selected (disabled) by deactivating ENA2. A first plot 701 is a waveform at node A between a "wire load" 108 and an inverting gate 103, in which node A is before the first input port 97B of the clock-switching (function-block) gate 99. Because the output clock from Ring Oscillator 1's (RO1's) 121 output (RO1_out) (with 50% of duty ratio) is transferred to node A through only the symmetrical gates (buffer gate 115 and inverting gates 103), the high period ($t_{high\_duty\_50}$ 706) and low period ($t_{low\_duty\_50}$ 707) in the waveform of plot 701 at node A are almost the same, which gives a duty ratio of about 50%. A second plot 702 is a waveform at node B between a "wire load 1" 110 and the clock-switching (function-block) gate 99. The node B is the first input port 97B of the clock-switching (function-block) gate 99. A third plot 703 is a waveform at node C between a "wire load" 108 and an inverting gate 103 at the boundary of clock-switching block 150 and the distribution line 200, which is after the clock-switching (function-block) gate 99. Comparison of the second plot 702 and the third plot 703 illustrates that a time of delay $t_{fall\_to\_rise\_delay}$ 708 from falling edge in the plot 702 to rising edge in the plot 703 and a time of delay $t_{rise\_to\_fall\_delay}$ 709 from rising edge in the plot 702 to falling edge in the plot 703 are different. Also, a time for the rising slew $t_{rise\_slew}$ 710 in the plot 703, and a time for the falling slew $t_{fall\_slew}$ 711 in the plot 703 are different.

At the node C, both transfer delay and slew are unbalanced. A fourth plot 704 is a waveform at node D between a "wire load" 108 and an inverting gate 103 of the distribution line 200. The fourth plot 704 illustrates the rise and fall slew balance is recovered. A fifth plot 705 is a waveform at node E of the distribution line. This waveform of plot 705 is an inversion of the waveform of plot 704 to adjust polarity to the original waveform of plot 701 for comparison. The high and low periods in the waveform of plot 705 are $t_{high\_unb}$ 712 and $t_{low\_unb}$ 713, respectively. In this sequence, the duty ratio for the waveform of plot 705 in the fifth plot is degraded (e.g., over 50%).

Figure 9:
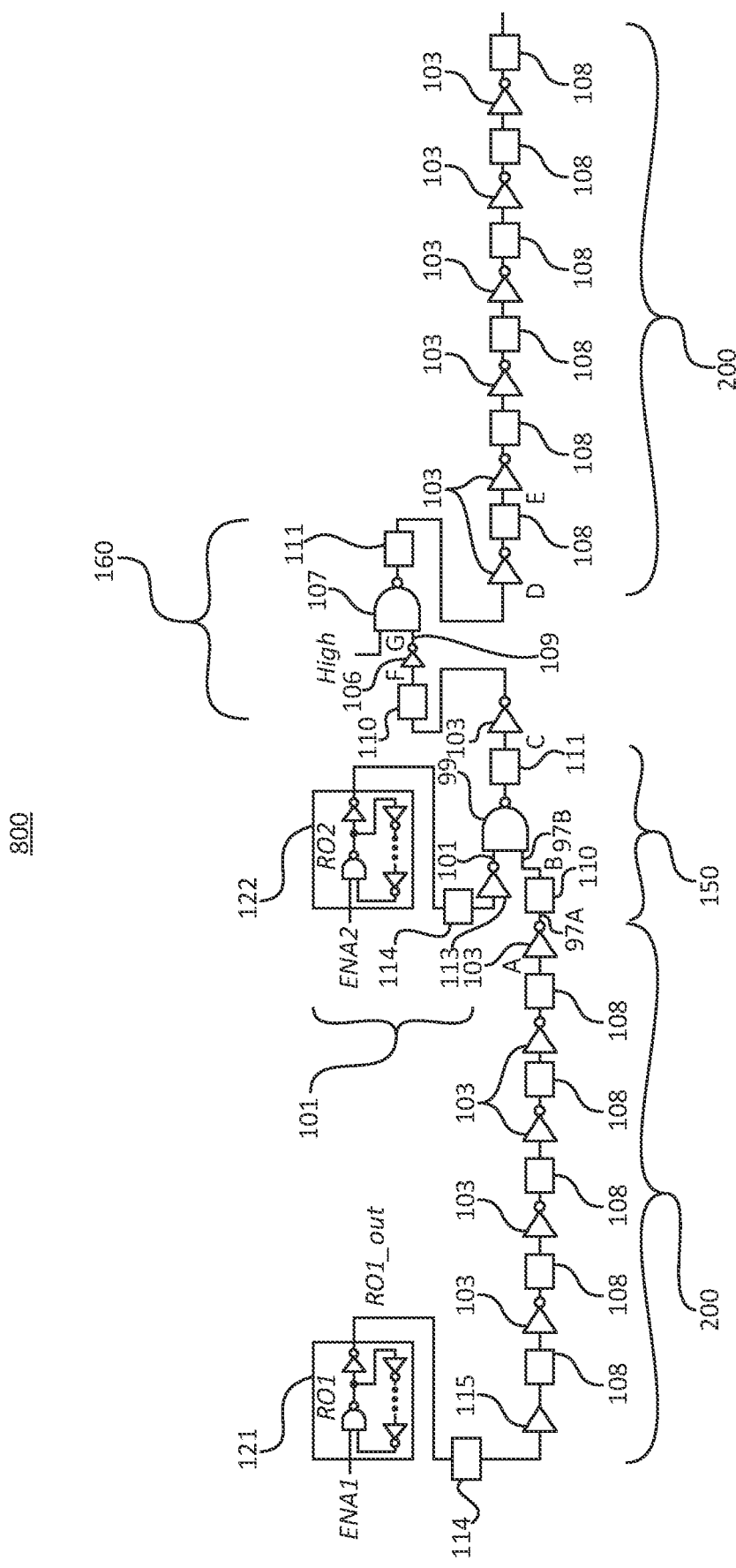
FIG. 9 is a circuit diagram of a clock distribution line with a clock-switching function for illustrating duty ratio compensation by a duty-compensation block, in accordance with an embodiment of the present invention.

FIG. 9 illustrates a circuit diagram of a circuit 800 including the duty-compensation block 160. This circuit 800 includes two of two-input gates (e.g., NAND (2) 500 in FIG. 3), with fast (strong) rise output, and slow (weak fall output) as clock-switching (function-block) gate 99 and duty-compensation gate 107. In order to implement the circuit 800 in FIG. 9, duty-compensation block 160 in inserted after clock-switching block 150 to the circuit 600 depicted in FIG. 7. More specifically, one of the "wire loads" 108 between node C and node D in the circuit 600 depicted in FIG. 7 should be replaced with duty-compensation block 160. In some embodiments, an inverting gate 103 is placed between the clock-switching block 150 and the duty-compensation block 160 to recover slew recovery for slow edge.

In some embodiments, the first input port 109 of the duty-compensation gate 107 is connected to the output of a small inverting gate 106 which is placed for polarity adjustment. In some embodiments, the second input port 105 of the duty-compensation gate 107 is connected to the constant-high signal such as power supply (Vdd) line. Other detailed explanation for duty-compensation block 160 is the same for clock-gating and clock-switching functions which are aforementioned with the circuit 100 in FIG. 1 and the circuit 300 in FIG. 2.

Figure 10:
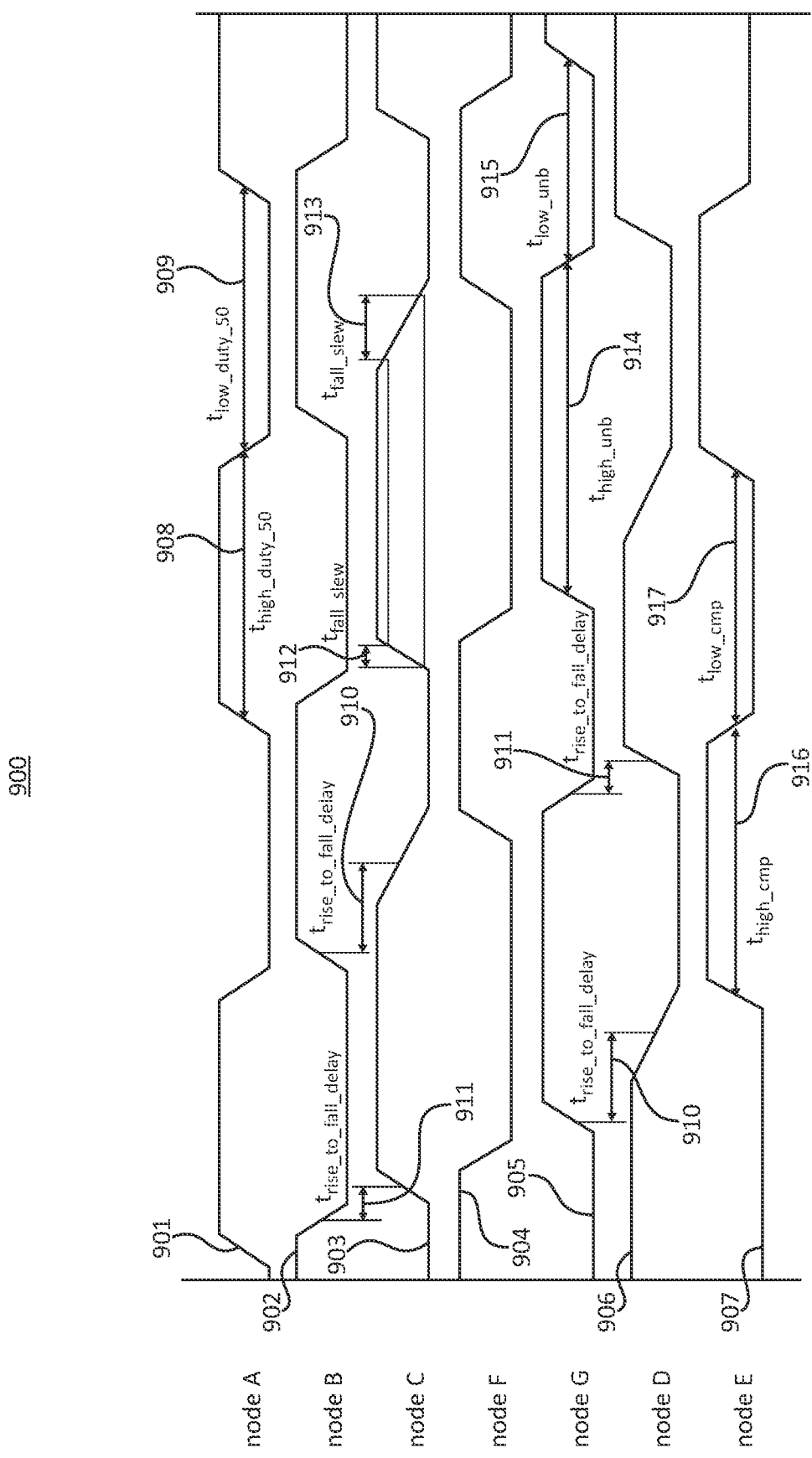
FIG. 10 is a timing diagram illustrating duty ratio compensation achieved by the circuit illustrated in the circuit diagram of FIG. 9, in accordance with an embodiment of the present invention.

FIG. 10 is a timing diagram 900 illustrating the duty ratio degradation and compensation with waveforms at several nodes included in the circuit diagram illustrated in FIG. 9. A first plot 901 is a waveform at node A between a "wire load" 108 and an inverting gate 103, in which node A precedes the first input port 97B of the clock-switching (function-block) gate 99. Because the output clock from Ring Oscillator 1's (RO1's) 121 output (RO1_out) (with 50% of duty ratio) is transferred to node A through only the symmetrical gates (e.g., buffer gate 115 and inverting gates 103), the high period ($t_{high\_duty\_50}$ 908) and low period ($t_{low\_duty\_50}$ 909) in the waveform of plot 901 at node A are almost same, which gives a duty ratio of about 50%. A second plot 902 is a waveform at node B between a "wire load 1" 110 and the clock-switching (function-block) gate 99, in which node B is the input port 97B of the clock-switching (function-block) gate 99. A third plot 903 is a waveform at node C between a "wire load 2" 111 and an inverting gate 103, which is at the boundary of the clock-switching block 150 and inverting gate 103 for slew recovery.

Comparison of the second plot 902 and the third plot 903 illustrates that a time of delay $t_{fall\_to\_rise\_delay}$ 911 from falling edge in the plot 902 to rising edge in the plot 903 and a time of delay $t_{rise\_to\_fall\_delay}$ 910 from rising edge in the plot 902 to falling edge in the plot 903 are different. Also, a time for the rising slew $t_{rise\_slew}$ 912, and a time for the falling slew $t_{fall\_slew}$ 913 in the plot 903 are different. At the node C, both transfer delay and slew are unbalanced. The fourth plot 904 is a waveform at node F between a "wire load 1" 110 and an inverting gate 106 in the duty-compensation block 160. A fourth plot 904 illustrates the rise and fall slew balance is recovered. A fifth plot 905 is a waveform at node G in the duty-compensation block 160. Node. The fifth plot 905 illustrates the signal polarity being adjusted by the inverting gate 106 before the clock signal is supplied to the duty-compensation gate 107.

A sixth plot 906 is a waveform at node D between a "wire load 2" 111 and an inverting gate 103, which is at the boundary of the duty-compensation block 160 and the distribution line 200. The sixth compensation plot 906 illustrates that the transfer delay balance is recovered although the slew balance is not recovered. A seventh plot 907 illustrates the slew balance is recovered with an inverting gate 103.

Comparison of the fifth plot 905 and the sixth plot 906 illustrates a time of delay $t_{rise\_to\_fall\_delay}$ 910 from rising edge in the plot 905 to falling edge in the plot 906 and a time of delay $t_{fall\_to\_rise\_delay}$ 911 from falling edge in the plot 905 to rising edge in the plot 906 are different. These delay values $t_{rise\_to\_fall\_delay}$ 910 and $t_{fall\_to\_rise1\_delay}$ 911 are also included in the relationship between waveforms of plot 902 and plot 903 because the compensation gate 107 uses the same one that is used for the clock-switching (function-block) gate 99 in the FIG. 9. In the plot 905, the time of high period $t_{high\_unb}$ 914 and the time of low period $t_{low\_unb}$ 915 are different due to unbalanced delay values in the clock-switching (function-block) gate 99 in the FIG. 9, and duty ratio is degraded. In the plot 907, however, the time of high period $t_{high\_cmp}$ 916 and the time for low period $t_{low\_cmp}$ 917 are equalized due to unbalanced delay values in the compensation gate 107 in the FIG. 9 and duty ratio is compensated.

The seventh plot 907 is a waveform at node E between a "wire load" 108 and an inverting gate 103 of the distribution line. As the compensation results, the high period $t_{high\_cmp}$ 916 and low period $t_{low\_cmp}$ 917 are almost same which gives a duty ratio of about 50% for the seventh plot 907 at the node E.

Comparing FIG. 7 and FIG. 9, FIG. 7 includes the clock-switching block 150 only and FIG. 9 includes the duty-compensation block 160 in addition to the clock-switching block 150. Comparison of FIG. 8 and FIG. 10 shows that the waveforms of plot 701 to plot 705 for the nodes A to E in the FIG. 7 have almost the same waveforms of plot 901 to plot 905 for the nodes A to C, F and G in FIG. 9 because both front-end circuits in the FIG. 7 and FIG. 9 up to the clock-switching block 150 are same. The duty-compensated waveforms generated by the duty-compensation block 160 in the FIG. 9 are shown as waveform plots 906 at node D and 907 at node E in FIG. 10. With these comparisons, the effect of the duty compensation is verified.

FIG. 11 is a block diagram 1100 illustrating a method for a duty-compensation scheme, in accordance with an embodiment of the present invention. The same reference numbers are used as in other FIGS. The method may begin with configurating a distribution line 200 to include a function-block gate 99 having two input ports at block 1101. The function-block gate 99 can be configured for clock gating or clock switching. At block 1102, the method can continue with inserting a duty-compensation gate 107 within the distribution line 200 for balancing rise-to-fall delay and fall-to-rise delay. In some examples, the duty-compensation gate 107 has a same electrical performance as the function-block gate 99.

The method for compensating duty of the global clock can further include inputting the clock signal to a first input port 109 of the duty-compensation gate 107 at block 1103. The method for compensating duty ratio of the global clock can also include inputting a constant-high signal to a second input port 105 of the duty-compensation gates 107 at block 1104. Further, the method may include outputting a duty-compensated clock signal from the duty-compensation gate 107 to the distribution line 200 following where the output port of duty-compensation gate 107 is connected to the distribution line 200 at block 1105.

In one embodiment, the method supplies the clock signal to a "wire load 1" 110 through inverting gates 106 for polarity adjustment to a first input port 109 of the duty-compensation gate 107, and supplies constant-high signal, e.g., VDD, to the second input port 105 of the duty-compensation gate 107, to delay an earlier input-signal edge of the clock signal more than a later input-signal edge of the clock signal in order to compensate delay unbalance.

In one embodiment, the method further includes inserting the duty-compensation gate 107 just after function-block gate 99. The same gates are used for the function-block gate 99 and the duty-compensation gate 107. Further the performance of the function-block gate 99 and the duty-compensation gate 107 are almost the same due to close placement. The function-block gate 99 and the duty-compensation gate 107 are affected by process, voltage and temperature (PVT) variations in the same way and with the same amount because they are placed closely in the distribution line 200. Thus, the duty-compensation works correctly even with PVT variations across a device. The performance characteristics of circuits in a digital integrated circuit vary with unavoidable changes in process parameters during their manufacture, with changes in their supply voltage, and with the temperature of their environment. Even within the same system, it is not uncommon for these "PVT" variations to vary the operating speed and the rate of current change (di/dt) over a very wide range from their nominal values. Logic circuits must therefore be specified for extreme worst-case conditions rather than nearer the nominal values.

Disadvantages accrue at both ends of the performance range. Off-chip driver circuits on a chip increase the power of signals on the chip and supply them to external package pins for transmission to another chip or to some other device. Operation of off-chip drivers greatly in excess of their nominal speed increases their di/dt enough to create excessive spikes on the supply-voltage and ground busses of the chip, which couples enough noise into the logic circuits and signal lines to produce faults in the signals on the chip.

Excessive speed can also cause "early mode" clock failures, resulting in the storing and transmission of false data in the signal lines. Many digital circuits use at least two different clock phases which are nonoverlapping. For example, a conventional master/slave latch receives and stores the state of its data input at the leading and trailing edges respectively of a first clock pulse, and transmits and stores that data at its output at the rising and falling edges of a second clock pulse. If the clocks overlap, an early-arriving data input level can propagate through the master latch, and then be latched into the slave latch one cycle early.

At the other end of the time scale, a low speed in the chip circuits can cause "late mode" clock failures. In a multi-chip system, each clock line to the various chips are carefully routed on a circuit board or substrate so that the signal arrives at all chips as nearly simultaneously as possible, so that signals traveling from chip to chip can be processed and stored accurately. PVT variations among the different chips of the system can still skew the arrival of the clock signals at the circuits on each chip which process the signals. In conventional chips, this chip-to-chip skew limits the minimum cycle time which can be reliably obtained for the entire system.

Low speed also limits the overall speed of the off-chip drivers. Thus, limiting the di/dt to a safe value for fast circuits may greatly decrease the performance of the entire chip at low circuit speeds.

In some embodiments, the proposed duty-compensation schemes described herein can overcome the aforementioned PVT variations, because by placing the duty-compensation gate 107 close to the function-block gate 99 which causes the delay unbalance. More particularly, the duty-compensation gate 107, for example, has larger delay in rise-to-fall input-to-output switching than in fall-to-rise input-to-output switching. This enables delay in an earlier-arrival edge of the clock signal to the input more than a later-arrival edge of the clock signal to the input in order to compensate delay unbalance. The amount of these delays are the same as that of function-block gate 99.

Figure 12:
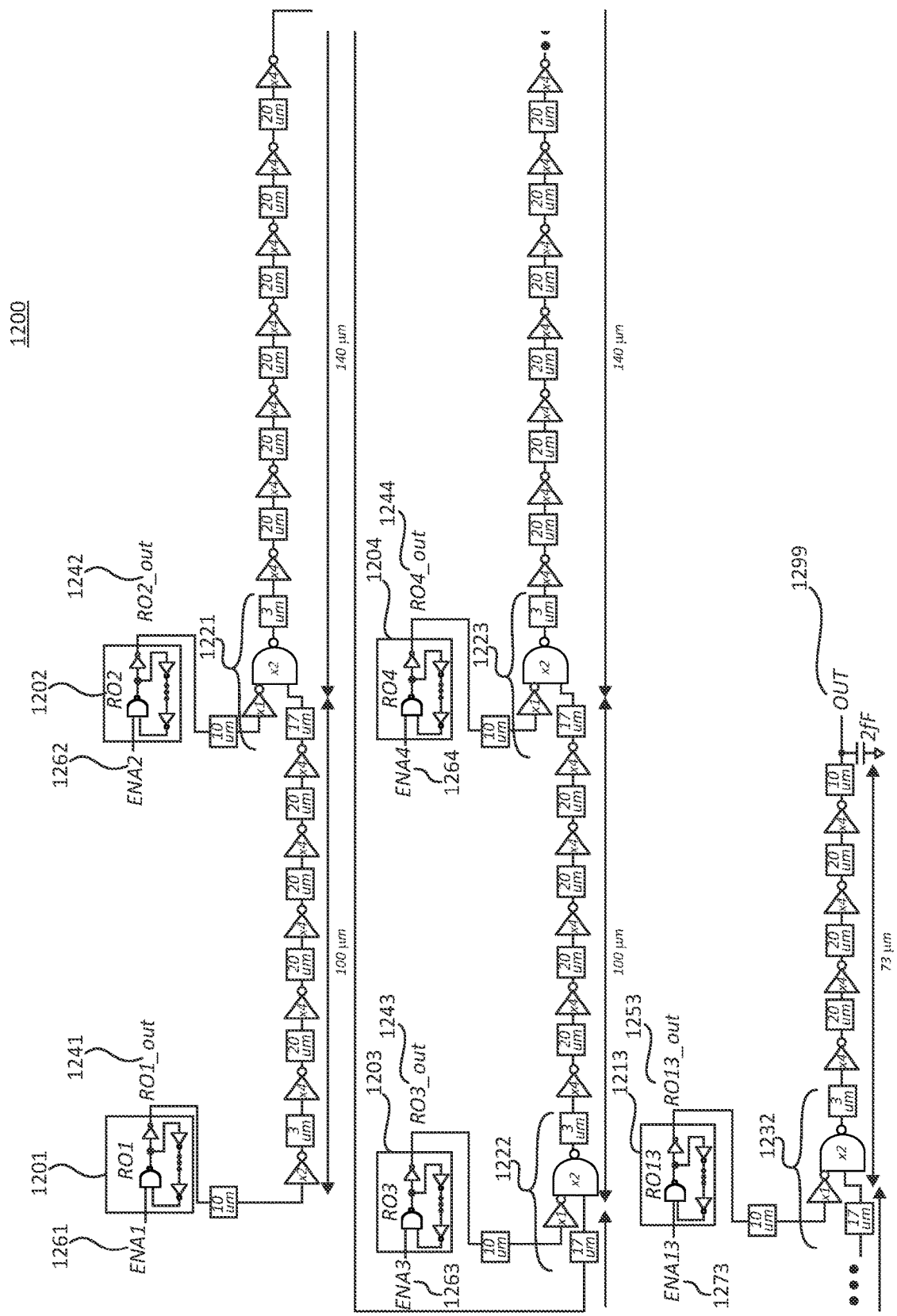
FIG. 12 is a circuit diagram for depicting multiple ring oscillators as clock sources, a clock distribution circuit including real length wire loads with multiple numbers (e.g., a total of 12) of function blocks including clock-switching (function-block) gates but without duty-compensation block for performance comparison, in accordance with an embodiment of the present invention.

The circuit 600 in FIG. 7 can be expanded to larger circuits which can include more than two Ring Oscillators (ROx) and multiple clock-switching blocks 150. FIG. 12 is a circuit diagram for depicting a circuit 1200 in which a total of thirteen Ring Oscillators (ROx) (1201, 1202, . . . , 1213) (x: 1 to 13) and 12 of 2-to-1 clock-switching blocks (1221, 1222, . . . , 1232) are included. The ROxs and OUT 1299 node are, for example, placed from RO1 1201 to RO13 1213 and OUT 1299 from left to right in a certain distance (for example, 100 um, 140 um, 100 um, . . . , 100 um, 140 um, 73 um in this example) and ROxs (x: 1 to 13) (1201, 1202, . . . , 1213) generate clock signal ROx_out (x: 1 to 13) (1241, 1242, . . . , 1253). The multiplexed output OUT 1299 of these 13 ROx are placed at the right-most end although the figure is folded several times. The clock distribution line which includes buffer gates or inverting gates and parasitic wire loads of a certain length is placed between the ROxs. The clock-switching blocks (1221, 1222, . . . , 1232) are placed at the clock merge point of ROx_out signals into the clock distribution line. For example, clock-switching block 1223 is placed at the clock merge point of RO4_out into the clock distribution line. Only one of ENAx (1261, 1262, . . . , 1273) signals is enabled and the others are disabled. The ROx_out for enabled ROx is transferred to the OUT 1299 at the right-most end.

With this circuit 1200 in FIG. 12, the number of clock-switching blocks through which selected ROx_out signal is transferred to OUT 1299 node is nclk_swt wherein, $$n_{clk\_swt} = \begin{matrix} (14-x) & (x=2,\ldots,13), \\ 12 & (x=1) \end{matrix} \qquad (1)$$

In case ENA13 1273 is activated, x is 13 and nelk_swt is 1. The RO13 1213 is enabled and its output clock signal RO13_out 1253 passes through only one clock-switching block 1232 to be transferred to OUT 1299 node. In this case, the amount of duty-ratio degradation is small because the clock signal RO13_out 1253 from RO13 1213 passes only one clock-switching block 1232. However, in case ENA1 1261 is activated, x is 1 and nclk_swt is 12. The RO1 1201 is enabled and its output clock signal RO1_out 1241 passes through 12 of clock-switching gates 1221, 1222, . . . , 1232 to be transferred to OUT 1299 node. In this case, the amount of duty degradation is accumulated 12 times and not negligible. The same amount of duty degradation is caused in case EN2 1262 is activated because nclk_swt in the equation (1) is also 12 for x is 2 case. The RO2_out 1242 is selected to pass through 12 of clock-switching gates 1221, 1222, . . . , 1232 to be transferred to OUT 1299 node.

Figure 13:
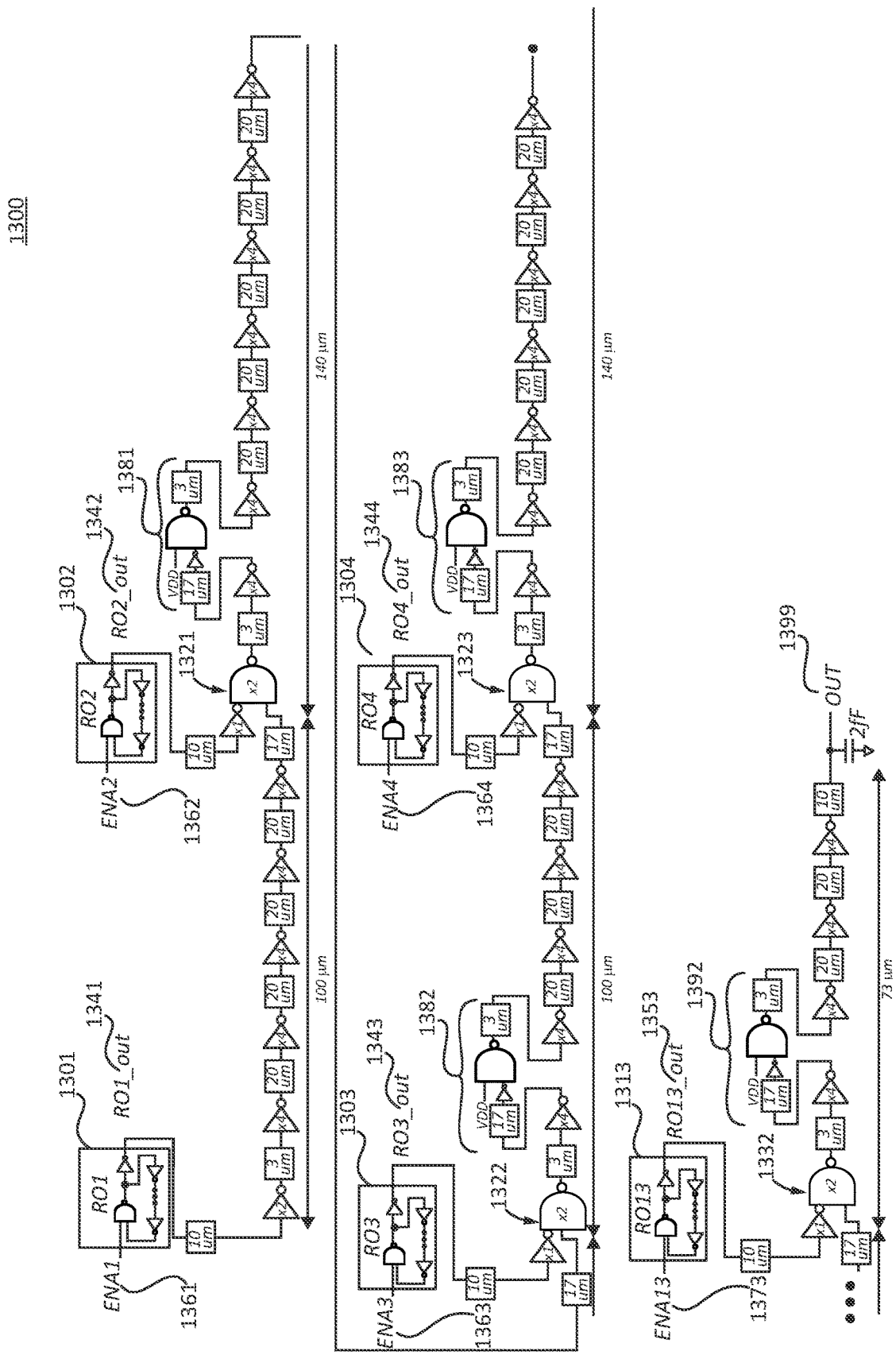
FIG. 13 is a circuit diagram for depicting a multiple number of ring oscillators as clock sources, a clock distribution circuit including real length wire loads with multiple numbers of function blocks including clock-switching (function-block) gates and multiple numbers of duty-compensation blocks including duty-compensation gates, in accordance with an embodiment of the present invention.

The circuit 800 in FIG. 9 can be expanded to larger circuits which include more than two Ring Oscillators (ROx) and multiple clock-switching blocks 150 and multiple duty-compensation blocks 160. FIG. 13 is a circuit diagram for depicting a circuit 1300 in which total 13 of Ring Oscillators (ROx) (1301, 1302, . . . , 1313) (x: 1 to 13) and the 12 of 2-to-1 clock-switching blocks (1321, 1322, . . . , 1332) are included. The ROxs and OUT 1399 node are, for example, placed from RO1 1301 to RO13 1313 and OUT 1399 from left to right in a certain distance (for example 100 um, 140 um, 100 um, . . . , 100 um, 140 um, 73 um, in this example), and they generate clock signal ROx_out (x: 1 to 13) (1341, 1342, . . . , 1353).

The multiplexed output OUT 1399 of these 13 ROx is placed at the right-most end. The clock distribution line which includes buffer gates or inverting gates and parasitic wire loads of a certain length is placed between the ROxs. The listed blocks which are included in the circuit 1300 in FIG. 13 are same as those included in the circuit 1200 in FIG. 12. The additional blocks, that is, the duty-compensation blocks (1381, 1382, . . . , 1392) are placed just after the corresponding clock-switching blocks (1321, 1322, . . . , 1332) to track PVT variations. Only one of ENAx (1361, 1362, . . . , 1373) signals is enabled and the others are disabled. The Rox_out for enabled Rox is transferred to OUT 1399 at the right-most end.

With this circuit 1300 in FIG. 13, the number of duty-compensation blocks through which selected ROx_out signal is transferred to OUT 1399 node is $n_{duty\_cmp}$, wherein, $$n_{duty\_cmp} = \begin{matrix} (14-x) & (x=2,\ldots,13), \\ 12 & (x=1) \end{matrix} \qquad (2)$$

In case ENA13 1373 is activated, RO13 1313 is enabled and its output clock signal RO13_out 1353 passes through only one clock-switching block 1332 and only one duty-compensation block 1392 to be transferred to OUT 1399 node. For any x from 1 to 13, $n_{duty\_cmp}$ in the equation (2) is equals to $n_{clk\_swt}$ in the equation (1). Even if any one of ENAx (1361, 1362, . . . , 1373) signals is activated and any one of ROx_out (1341, 1342, . . . , 1353) signals is selected to be transferred to OUT 1399 node, the selected ROx_out (1341, 1342, . . . , 1353) passes through one or several clock-switching (function) blocks (1321, 1322, . . . , 1332) and the same number of duty-compensation blocks (1381, 1382, . . . , 1392) as the clock-switching (function) blocks and the duty ratio of clock signal at OUT 1399 node is almost 50%.

Referring to FIG. 14, the duty ratio values for all ring oscillators ROx_out (1241/1341, 1242/1342, . . . , 1253/1353) in both the circuit 1200 depicted in FIG. 12 and the circuit 1300 depicted in FIG. 13 are 50.7%, as listed in TABLE 1 1401. This result shows all ring oscillators in the circuits 1200 and 1300, in a single unit, generate clock signals with almost 50% duty ratio. TABLE 2 1402 shows the duty ratio of the output clock at OUT 1299 node varies in the range from 50.23% to 59.97% with the circuit 1200 depicted in FIG. 12. The clock corresponds to one of the selected ROx_out 1241, 1242, . . . , 1253 clock signals which is transferred to OUT 1299 node.

TABLE 3 1403 shows the same duty ratio values as TABLE 2 1402 for the circuit 1300 depicted in FIG. 13. With the operation of duty-compensation blocks (1381, 1382, . . . , 1392) the duty ratio at OUT 1399 node varies in the range from 49.37% to 49.62% with the circuit 1300 depicted in FIG. 13. The clock corresponds to one of selected ROx_out 1341, 1342, . . . , 1353 clock signals which is transferred to OUT 1399 node.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

For purposes of the description hereinafter, the terms "upper", "lower", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g., interface layer, may be present between the first element and the second element. The term "direct contact" means that a first element, such as a first structure, and a second element, such as a second structure, are connected without any intermediary conducting, insulating or semiconductor layers at the interface of the two elements.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a duty-compensation scheme which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A global clock signal distribution system, comprising:
   a distribution line that includes gates for signal distribution;
   a function block gate with at least two input ports; and
   a duty compensation gate with at least two input ports, wherein the duty compensation gate is inserted in the distribution line following the function block gate for balancing rise-to-fall delay and fall-to-rise delay, the duty compensation gate delays an earlier arrived edge of a clock signal more than a later arrived edge of the clock signal to compensate delay unbalance.

2. The global clock signal distribution system of claim 1, wherein the gates for signal distribution include inverter gates or buffer gates.

3. The global clock signal distribution system of claim 1, wherein the function block gate with multiple input ports is configured for clock gating.

4. The global clock signal distribution system of claim 1, wherein the function block gate with multiple input ports is configured for clock switching.

5. The global clock signal distribution system of claim 1, wherein the function block gate and the duty compensation gate have a same structure.

6. The global clock signal distribution system of claim 1, wherein the duty compensation gate receives a clock signal before duty compensation to a first input port and a constant high signal to a second input port.

7. The global clock signal distribution system of claim 1, wherein the duty compensation gate is positioned proximate to the function block gate to have a same electrical performance.

8. The global clock signal distribution system of claim 1, wherein an equal number of function block gates and duty compensation gates are placed in the distribution line to select one clock signal out of multiple input clock signals.

9. A global clock signal distribution system comprising:
   a distribution line that includes gates for signal distribution;
   a function block gate; and
   a duty compensation gate having a same structure as the function block gate, the duty compensation gate being positioned in the distribution line following the function block gate to balance rise-to-fall delay and fall-to-rise delay within the distribution line, where the duty compensation gate delays an earlier arrived edge of a clock signal more than a later arrived edge of the clock signal to compensate delay unbalance.

10. The global clock signal distribution system of claim 9, wherein the gates for signal distribution include inverter gates or buffer gates.

11. The global clock signal distribution system of claim 9, wherein the function block gate is configured for clock-gating.

12. The global clock signal distribution system of claim 9, wherein the function block gate is configured for clock-switching.

13. The global clock signal distribution system of claim 9, wherein the function block gate and the duty compensation gate have a same electrical performance.

14. The global clock signal distribution system of claim 9, wherein the duty compensation gate receives a clock signal at a first input port and a second input port is set to high.

15. The global clock signal distribution system of claim 9, wherein the duty compensation gate is placed close to a corresponding function block gate to have a same electrical performance.

16. The global clock signal distribution system of claim 9, wherein an equal number of function block gates and duty compensation gates are placed in the distribution line to select one clock signal out of multiple input clock signals.

17. A global clock signal distribution method comprising:
   configuring a distribution line with gates for signal distribution and a function block gate with at least two input ports; and
   positioning a duty compensation gate with at least two input ports in the distribution line following the function block gate, wherein the duty compensation gate balances rise-to-fall delay and fall-to-rise delay and the duty compensation gate delays an earlier arrived edge of a clock signal more than a later arrived edge of the clock signal to compensate delay unbalance.

18. The method of claim 17, wherein the function block gate with multiple input ports is configured for clock gating or clock switching.

19. The method of claim 17, wherein the function block gate and the duty compensation gate have a same electrical performance.

20. The method of claim 17, wherein the duty compensation gate receives a clock signal to a first input port and includes a second input port set to high, wherein the duty compensation gate is placed as close to a corresponding function block gate as possible to have a same electrical performance.

* * * * *